United States Patent
Chen et al.

(10) Patent No.: US 9,825,118 B2
(45) Date of Patent: Nov. 21, 2017

(54) HIGH VOLTAGE METAL-OXIDE-METAL (HV-MOM) DEVICE, HV-MOM LAYOUT AND METHOD OF MAKING THE HV-MOM DEVICE

(71) Applicant: TAIWAN SEMICONDUCTOR MANUFACTURING COMPANY, LTD., Hsinchu (TW)

(72) Inventors: Chia-Chung Chen, Keelung (TW); Shu Fang Fu, Xinpu Township (TW); Chang-Sheng Liao, Zhudong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/071,725

(22) Filed: Mar. 16, 2016

(65) Prior Publication Data

US 2016/0197138 A1    Jul. 7, 2016

Related U.S. Application Data

(62) Division of application No. 13/945,435, filed on Jul. 18, 2013, now Pat. No. 9,305,920.

(51) Int. Cl.
 *H01L 49/02* (2006.01)
 *H01L 27/06* (2006.01)
 *H01L 27/08* (2006.01)

(52) U.S. Cl.
 CPC .......... *H01L 28/87* (2013.01); *H01L 27/0629* (2013.01); *H01L 27/0805* (2013.01); *H01L 28/88* (2013.01)

(58) Field of Classification Search
 USPC .......................... 257/296, 309, 534; 438/253
 See application file for complete search history.

(56) References Cited

U.S. PATENT DOCUMENTS

| 2002/0022332 A1* | 2/2002 | Arnal ...................... H01L 28/55 438/386 |
| 2003/0113967 A1* | 6/2003 | Allman ............. H01L 21/76838 438/253 |
| 2005/0077581 A1 | 4/2005 | Chang et al. |
| 2006/0197134 A1 | 9/2006 | Phan |

(Continued)

FOREIGN PATENT DOCUMENTS

TW    200535880    11/2005

*Primary Examiner* — Zandra Smith
*Assistant Examiner* — Lawrence Tynes, Jr.
(74) *Attorney, Agent, or Firm* — Hauptman Ham, LLP

(57) ABSTRACT

A high voltage metal-oxide-metal (HV-MOM) layout includes a first conductive element. The first element includes a first leg extending in a first direction, a second leg connected to the first leg, the second leg extending in a second direction different from the first direction, and a third leg connected to the second leg, the third leg extending in a first direction. The HV-MOM layout further includes a second conductive element separated from the first conductive element by a space. The second conductive element includes a serpentine structure, wherein the serpentine structure is enclosed on at least three sides by the first conductive element. The HV-MOM layout further includes a dielectric material filling the space between the first conductive element and the second conductive element.

20 Claims, 9 Drawing Sheets

(56) References Cited

U.S. PATENT DOCUMENTS

| | | | |
|---|---|---|---|
| 2008/0006868 A1* | 1/2008 | Hsu | H01L 27/115 257/314 |
| 2008/0191291 A1 | 8/2008 | Wu | |
| 2009/0020800 A1 | 1/2009 | Tempel | |
| 2010/0059851 A1* | 3/2010 | Ellis | H01L 27/0629 257/500 |
| 2012/0267715 A1* | 10/2012 | Chou | H01L 29/1045 257/336 |
| 2014/0151793 A1 | 6/2014 | Cha | |

* cited by examiner

HIGH VOLTAGE METAL-OXIDE-METAL (HV-MOM) DEVICE, HV-MOM LAYOUT AND METHOD OF MAKING THE HV-MOM DEVICE

PRIORITY CLAIM

The present application is a divisional of U.S. application Ser. No. 13/945,435, filed Jul. 18, 2013, which is incorporated herein by reference in its entirety.

BACKGROUND

In integrated circuit designs, on-chip capacitors are used in various applications including dynamic random access memories (DRAM), voltage controlled oscillators (VCO), phase-lock loops, operational amplifiers and other circuit designs. On-chip capacitors are also used to decouple circuits from noise in a separate portion of an electrical system.

Metal-oxide-metal (MOM) capacitors are a type of on-chip capacitor. MOM capacitors are formed using metal lines and metal vias in an interconnect structure. A dielectric material of the interconnect structure is used as the oxide in an MOM capacitor.

High voltage (HV) applications are used in various applications, such as input/output devices. Core logic devices usually operate at a lower voltage than the input/output devices. A device operating using a high voltage, e.g., 5 volts, experiences more stress than devices operating using a lower voltage, e.g., 1.2 volts.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1A:
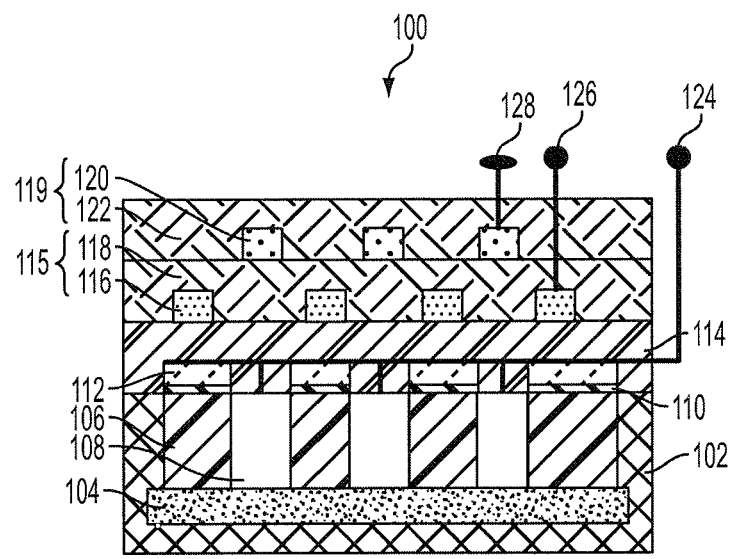
FIGS. 1A-1C are cross-sectional views of a high voltage metal-oxide-metal (HV-MOM) device in accordance with one or more embodiments.

FIG. 1A is a cross-sectional view of a high voltage metal-oxide-metal (HV-MOM) device 100 in accordance with one or more embodiments. HV-MOM device 100 includes a substrate 102. A deep well 104 is in substrate 102. A plurality of high voltage wells 106 is in substrate 102 between a top surface of the substrate and deep well 104. A plurality of isolation features 108 is in substrate 102 between the top surface of the substrate and deep well 104. Each isolation structure 108 separates adjacent high voltage wells 106 from each other. A dielectric layer 110 is over a top surface of each high voltage well 106. Dielectric layer 110 does not extend over a top surface of isolation features 108. A gate structure 112 is over dielectric layer 110. An inter-layer dielectric (ILD) layer 114 is over substrate 102 and surrounds dielectric layer 110 and gate structure 112. A first metal layer 115 including first metal features 116 is over ILD layer 114. A first inter-metal dielectric (IMD) layer 118 is over ILD layer 114 and surrounds first metal features 116. A second metal layer 119 including second metal features 120 is over first IMD layer 118. A second IMD layer 122 is over first IMD layer 118 and surrounds second metal features 120. A first contact 124 is electrically connected to each gate structure 112 and each isolation feature 108. A second contact 126 is electrically connected to at least one of first metal feature 116. A third contact 128 is electrically connected to at least one second metal feature 120. One of ordinary skill in the art would recognize that first contact 124, second contact 126 and third contact 128 are illustrated schematically.

In some embodiments, substrate 102 includes an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 102 is a strained SiGe substrate. In some embodiments, the semiconductor substrate includes a doped epi layer or a buried layer. In some embodiments, the compound semiconductor substrate has a multilayer structure, or the substrate includes a multilayer compound semiconductor structure. In some embodiments, substrate 102 is doped with p-type dopants such as boron, boron difluoride, or other suitable p-type dopants.

Deep well 104 is formed within substrate 102. In some embodiments, deep well 104 includes n-type dopants and is called a deep n-well (DNW). In some embodiments, the n-type dopants include phosphorus, arsenic or other suitable n-type dopants. In some embodiments, a dopant concentration in deep well 104 ranges from about $1\times10^{15}$ atoms/cm$^3$ to about $1\times10^{18}$ atoms/cm$^3$. In some embodiments, deep well 104 is formed by ion implantation. The power of the ion implantation ranges from about 1000 k eV to about 1500 k eV. In some embodiments, a depth of deep well 104 ranges from about 4 μm to about 6 μm. In some embodiments, a thickness of deep well 104 ranges from about 0.5 μm to about 4 μm.

High voltage wells 106 are in substrate 102. In some embodiments, high voltage wells 106 have an n-type dopant type. In some embodiments, the n-type dopant comprises phosphorus, arsenic or another suitable n-type dopant. In some embodiments, high voltage wells 106 have a p-type dopant type. In some embodiments, substrate 102 is doped with p-type dopants such as boron, boron difluoride, or other suitable p-type dopants. In some embodiments, a dopant species in high voltage wells 106 is the same as a dopant species in deep well 104. In some embodiments, the dopant species in high voltage wells 106 is different from the dopant species of deep well 104. In some embodiments, high voltage wells 106 include an epi-layer grown over substrate 102. In some embodiments, the epi-layer is doped by adding dopants during the epitaxial process. In some embodiments, the epi-layer is doped by ion implantation after the epi-layer is formed. In some embodiments, high voltage wells 106 are formed by doping substrate 102. In some embodiments, the doping is performed by ion implantation. In some embodiments, high voltage wells 106 have a dopant concentration ranging from $1\times10^{14}$ atoms/cm$^3$ to $1\times10^{19}$ atoms/cm$^3$.

Isolation features 108 electrically separate adjacent high voltage wells 106 from each other. In some embodiments, isolation features 108 are in physical contact with deep well 104. In some embodiments, isolation features are not in physical contact with deep well 104. In some embodiments, isolation features 108 include shallow trench isolation (STI), local oxidation of silicon (LOCOS), or other suitable isolation features. In some embodiments, isolation features 108 are electrically neutral portions of high voltage wells 106. In some embodiments, isolation features 108 are formed by etching high voltage wells 106 to form an opening and filling the opening with a non-conductive material.

Dielectric layer 110 provides electrical resistance between gate structures 112 and respective high voltage wells 106. In some embodiments, dielectric layer 110 includes a high-k dielectric material. A high-k dielectric material has a dielectric constant (k) higher than the dielectric constant of silicon dioxide. In some embodiments, the high-k dielectric material has a k value greater than 3.9. In some embodiments, the high-k dielectric material has a k value greater than 8.0. In some embodiments, dielectric layer 110 includes silicon dioxide (SiO$_2$), silicon oxynitride (SiON), hafnium dioxide (HfO$_2$), zirconium dioxide (ZrO$_2$) or other suitable materials. In some embodiments, dielectric layer 110 has a thickness ranging from 60 Angstroms (Å) to 80 Å. If the thickness is less than 60 Å, dielectric layer 100 will break down if a high voltage is conducted through PMOS transistor 100A, in some instances. If the thickness is greater than 80 Å, gate structures 112 cannot efficiently transfer charge to respective high voltage wells 106, in some instances.

Gate structures 112 are used to receive a voltage from first contact 124 and transfer that voltage to substrate 102 through respective high voltage wells 106 and deep well 104. Gate structures 112 receiving voltage from first contact 124 helps to form a parasitic capacitance with first metal features 116 to increase an input voltage for HV-MOM device 100. In some embodiments, gate structures 112 include a conductive material, such as polycrystalline silicon (polysilicon), aluminum (Al), copper (Cu), titanium (Ti), tantalum (Ta), tungsten (W), molybdenum (Mo), platinum (Pt), tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof. In some embodiments, the conductive material of gate structures 112 is doped or undoped depending on design requirements of an integrated circuit. In some embodiments, gate structures 112 include a work function layer tuned to have a proper work function for enhanced performance of HV-MOM device 100.

ILD layer 114 surrounds gate structures 112 and dielectric layer 110. In some embodiments, ILD layer 114 is a low-k dielectric material. In some embodiments, ILD layer 114 has a dielectric constant below 2.9. In some embodiments, ILD layer has a dielectric constant below 2.0. In some embodiments, ILD layer 114 includes multiple layers. In some embodiments, ILD layer 114 is formed using a Boro-Phospho-Silicate Glass (BPSG), PSG (phosphosilicate glass; phosphorus doped silicon glass), TEOS (tetraethoxysilane; tetraethylorthosilicate; tetraethelorthosilicate; tetrethoxysilicide), or any other suitable material and/or combinations thereof. BPSG is silicon dioxide (silica) with boron and phosphorus added, to lower the temperature at which glass (oxide) starts to flow from about 950° C. for pure SiO$_2$ to about 500° C. for BPSG. In some embodiments, BPSG is used to planarize the surface, and deposited by Chemical Vapor Deposition (CVD).

First metal layer 115 including first metal features 116 is over ILD layer 114. First metal features 116 include metal lines and metal vias. Metal vias are used to connect metal lines between various metal layers. FIG. 1A includes only first metal features 116 in first metal layer 115. In some embodiments, an additional set of metal features are formed on first metal layer 115. The additional set of metal features is separate from first metal features 116. In some embodiments, the additional set of metal features and first metal features 116 are used to form a capacitor. In some embodiments, first metal features 116 include copper, copper alloys, aluminum, aluminum alloys, tungsten, tungsten alloys, combinations thereof or other suitable conductive materials. In some embodiments, first metal features 116 are formed using physical vapor deposition (PVD), sputtering, or another suitable formation process. In some embodiments, first IMD layer 118 is formed prior to first metal features 116 and the first metal features are formed in openings in the first IMD layer. In some embodiments, the openings in first IMD layer 118 are formed by an etching process, such as reactive ion etch (RIE), wet etching, dry etching, combinations thereof, or other suitable material removal processes.

First IMD layer 118 separates first metal features 116 from other metal features or interconnect elements in first metal layer 115. In some embodiments, first IMD layer 118 includes a low-k dielectric layer. In some embodiments, first IMD layer 118 is a same material as ILD layer 114. In some embodiments, first IMD layer 118 is a different material from ILD layer 114.

Second metal layer 119 including second metal features 120 is over first IMD layer 118. Second metal features 120 include metal lines and metal vias. FIG. 1A includes only second metal features 116 in second metal layer 119. In some embodiments, an additional set of metal features are formed on second metal layer 119. The additional set of metal features is separate from second metal features 120. In some embodiments, the additional set of metal features and second metal features 120 are used to form a capacitor. In some embodiments, first metal features 116 and second meal features 118 are used to form a capacitor. In some embodiments, second metal features 120 include copper, copper alloys, aluminum, aluminum alloys, tungsten, tungsten alloys, combinations thereof or other suitable conductive materials. In some embodiments, second metal features 120 include a same material as first metal features 116. In some embodiments, second metal features 120 include a different material from first metal features 116. In some embodiments, second metal features 120 are formed using physical vapor deposition (PVD), sputtering, or another suitable formation process. In some embodiments, second IUD layer 122 is formed prior to second metal features 120 and the second metal features are formed in openings in the second IMD layer. In some embodiments, the openings in second IMD layer 124 are formed by an etching process, such as reactive ion etch (RIE), wet etching, dry etching, combinations thereof, or other suitable material removal processes.

Second IMD layer 122 separates second metal features 120 from other metal features or interconnect elements in second metal layer 119. In some embodiments, second IMD layer 122 includes a low-k dielectric layer. In some embodiments, second IMD layer 122 is a same material as ILD layer 114. In some embodiments, second IMD layer 122 is a different material from ILD layer 114. In some embodiments, second IMD layer 122 is a same material as first IMD layer 118. In some embodiments, second IMD layer 122 is a different material from first IMD layer 118.

First contact 124 is electrically connected to each gate structure 112 and each isolation feature 108. In some embodiments, first contact 124 is electrically connected to less than all gate structures 112 or less than all isolation features 108. In some embodiments, first contact 124 is formed using metal lines and metal vias through second IMD layer 122, first IMD layer 118 and ILD layer 114. In some embodiments, a voltage connected to first contact 124 is a ground voltage or a voltage source source (VSS) voltage. In some embodiments, a voltage connected to first contact 124 is a power voltage or a voltage drain drain (VDD) voltage. By electrically connecting first contact 124 to gate structures 112 over high voltage wells 106 and to isolation features 108, a voltage applied to first metal features 116 or second metal features 120 in order to form a capacitor is able to be increased. The electrical connection to gate structures 112 over high voltage wells 106 and to isolation features 108 increases a shielding effect of the gate structures 112 to enable the use of higher voltages. In some embodiments, the VDD voltage is greater than 1.2 volts (V). In some embodiments, the VDD voltage is at least 5 V.

Second contact 126 is electrically connected to first metal features 116. In some embodiments, second contact 126 is formed using metal lines and metal vias through second IMD layer 122 and first IMD layer 118. In some embodiments, a voltage connected to second contact 126 is a ground voltage or a VSS voltage. In some embodiments, a voltage connected to second contact 126 is a power voltage or a VDD voltage. In some embodiments, the VDD voltage is greater than 1.2 volts (V). In some embodiments, the VDD voltage is at least 5 V. In some embodiments which include additional metal features in first metal layer 115, an additional contact is electrically connected to the additional metal features to form a capacitor in first metal layer 115.

Third contact 128 is electrically connected to second metal features 120. In some embodiments, third contact 128 is formed using metal lines and metal vias through second IMD layer 122. In some embodiments, a voltage connected to third contact 128 is a ground voltage or a VSS voltage. In some embodiments, a voltage connected to third contact 128 is a power voltage or a VDD voltage. In some embodiments, the VDD voltage is greater than 1.2 volts (V). In some embodiments, the VDD voltage is at least 5 V. In some embodiments which include additional metal features in second metal layer 119, an additional contact is electrically connected to the additional metal features to form a capacitor in second metal layer 119.

HV-MOM device 100 is suitable for use in high voltage application, e.g., with an operating voltage of at least 5V, without dielectric layer 110 breaking down. In comparison with other MOM devices, HV-MOM device 100 experiences reduced noise induced by substrate 102. The reduced noise is a result of gate structures 112 and isolation features 108 receiving a voltage signal from first contact 124. In addition, HV-MOM device 100 is formed using complementary metal oxide semiconductor (CMOS) processes, which makes HV-MOM 100 easier to fabricate and reduces process induced variations because similar tools are able to implement the HV-MOM device that are used to implement other elements in an integrated circuit.

Figure 1B:
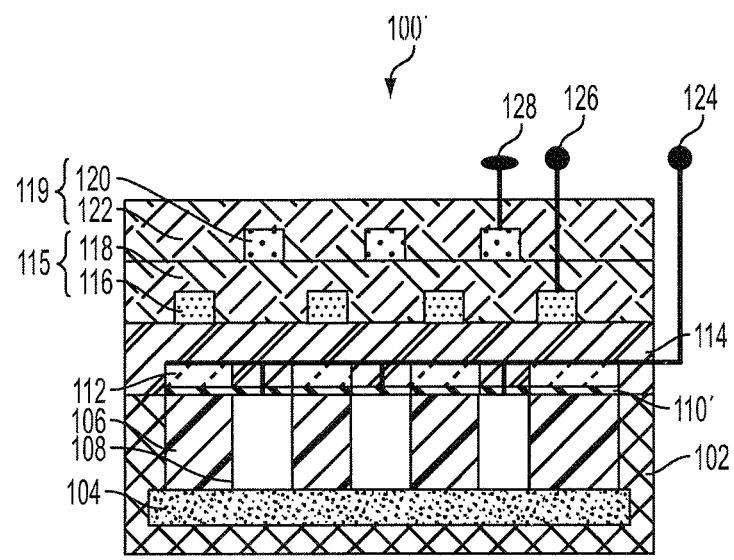

FIG. 1B is a cross-sectional view of an HV-MOM device 100' in accordance with one or more embodiments. HV-MOM devices 100' is similar to HV-MOM device 100. Similar elements have similar reference numbers. In comparison with HV-MOM device 100, HV-MOM device 100' includes dielectric layer 110' which continuously extends over high voltage wells 106 and isolation features 108. First contact 124 is electrically connected to isolation features 108 through dielectric layer 110'.

Figure 1C:
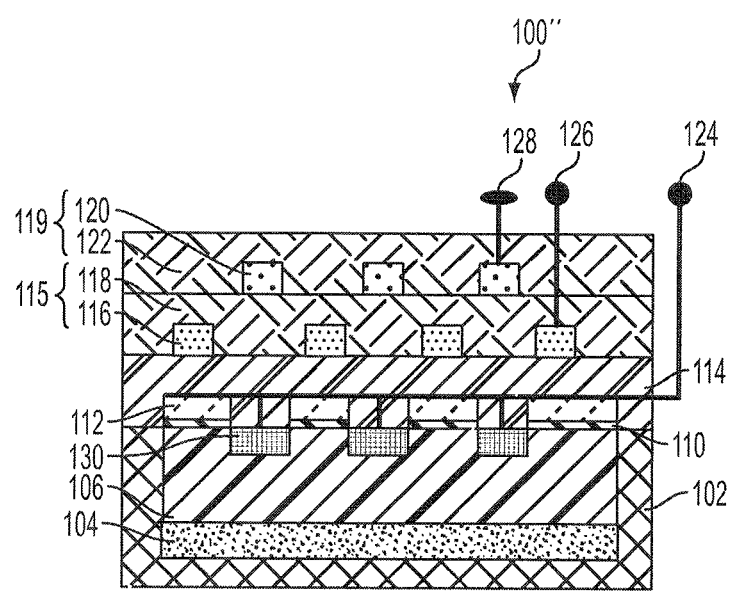

FIG. 1C is a cross-sectional view of an HV-MOM device 100" in accordance with one or more embodiments. HV-MOM devices 100" is similar to HV-MOM device 100. Similar elements have similar reference numbers. In comparison with HV-MOM device 100, HV-MOM device 100" does not include isolation features 108, but does include heavily doped regions 130. HV-MOM device 100" also includes a single high voltage well 106 surrounding heavily doped regions 130. First contact 124 is electrically connected to gate structures 112 and heavily doped regions 130.

Heavily doped regions 130 provide electrical connection between first contact 124 and high voltage well 106. In some embodiments, heavily doped regions 130 have a p-type dopant type and are located at a top surface of high voltage well 106. In some embodiments, heavily doped regions 130 are formed by etching high voltage well 106 to form a trench and growing the heavily doped regions in the trench. In some embodiments, dopants are introduced during the growing of heavily doped regions 130. In some embodiments, heavily doped regions 130 are doped following completion of the growing process. In some embodiments, heavily doped regions 130 are formed by doping high voltage well 106. In some embodiments, heavily doped regions 130 are formed by ion implantation into high voltage well 106. In some embodiments, heavily doped regions 130 have a same dopant type as high voltage well 106. In some embodiments, heavily doped regions 130 have a different dopant type from high voltage well 106. In some embodiments, a dopant species of heavily doped regions 130 is a same or a different dopant species from high voltage well 106. Heavily doped regions 130 have a higher dopant concentration than high voltage well 106. In some embodiments, heavily doped regions 130 have a dopant concentration ranging from about $1 \times 10^{20}$ atoms/cm$^3$ to about $1 \times 10^{23}$ atoms/cm$^3$.

Figure 2A:
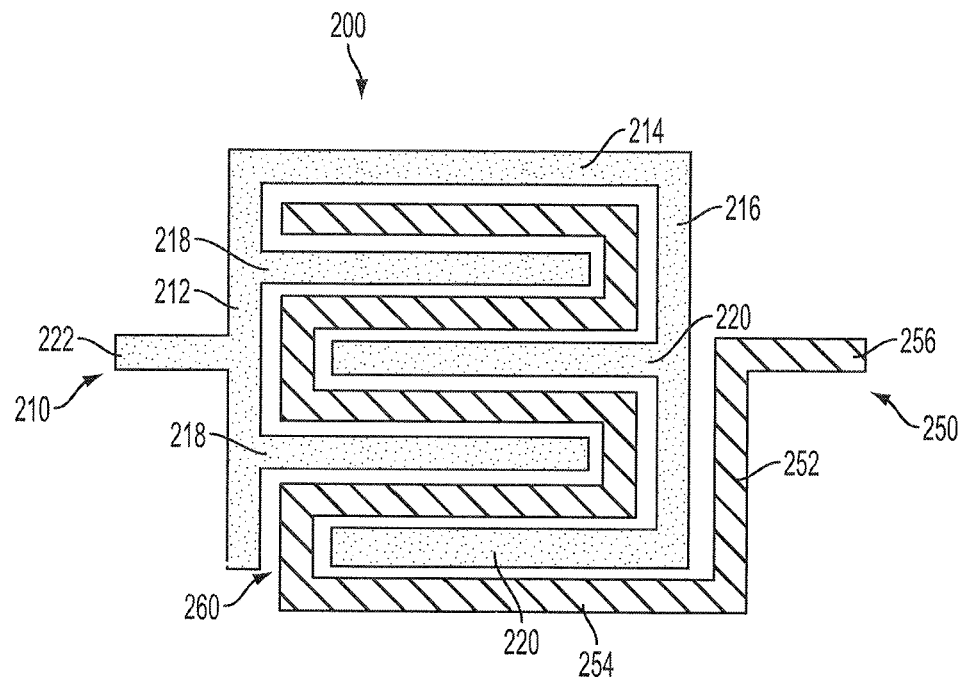
FIGS. 2A-2D are top views of an HV-MOM layout for a unit cell of a capacitor in accordance with one or more embodiments.

FIG. 2A is a top view of an HV-MOM layout 200 for a unit cell of a capacitor in accordance with one or more embodiments. HV-MOM layout 200 includes a first conductive element 210 separated from a second conductive element 250. In some embodiments, first conductive element 210 is on a same metal layer as second conductive element 250, e.g., first metal features 116 and additional metal features in first metal layer 115, as described above. In some embodiments, first conductive element 210 and second conductive element 250 are on separate metal layers, e.g., first metal features 116 and second metal features 120. In some embodiments, a separation between first conductive element 210 and second conductive element 250 ranges from about 0.1 microns (µm) to about 0.2 µm. A dielectric element, e.g., first IMD layer 118 or second IMD layer 122

(FIG. 1A), fills a space between first conductive element 210 and second conductive element 250.

First conductive element 210 includes a first leg 212 extending in a first direction. First conductive element 210 further includes a second leg 214 connected to first leg 212. Second leg 214 extends in a second direction different from the first direction. In some embodiments, the first direction is perpendicular to the second direction. First conductive element 210 further includes a third leg 216 connected to second leg 214. Third leg 216 extends in the first direction. First conductive element 210 further includes first branches 218 extending from first leg 212 in the second direction. First conductive element 210 further includes second branches 220 extending from third leg 216 in the second direction. In some embodiments, first conductive element 210 further includes a contact leg 222 configured to receive a voltage signal from a contact, e.g., second contact 126 or third contact 128 (FIG. 1A). In some embodiments, first conductive element 210 is configured to receive a voltage signal at various points along the first conductive elements through conductive vias in an interconnect structure.

Second conductive element 250 includes a first leg 252 extending in the first direction. Second conductive element 250 further includes a second leg 254 connected to first leg 252 extending in the second direction. Second conductive element further includes a serpentine structure 260 which includes portions extending in the first direction and portions extending in the second direction. In some embodiments, corners of serpentine structure 260 are rounded. In some embodiments, corners of serpentine structure 260 are angled. Serpentine structure 260 is configured to be interlaced with first branches 218 and with second branches 220 in an alternating fashion. In some embodiments, second conductive element 250 further includes a contact leg 256 configured to receive a voltage signal from a contact, e.g., second contact 126 or third contact 128 (FIG. 1A). In some embodiments, second conductive element 250 is configured to receive a voltage signal at various points along the first conductive elements through conductive vias in an interconnect structure.

Figure 2B:
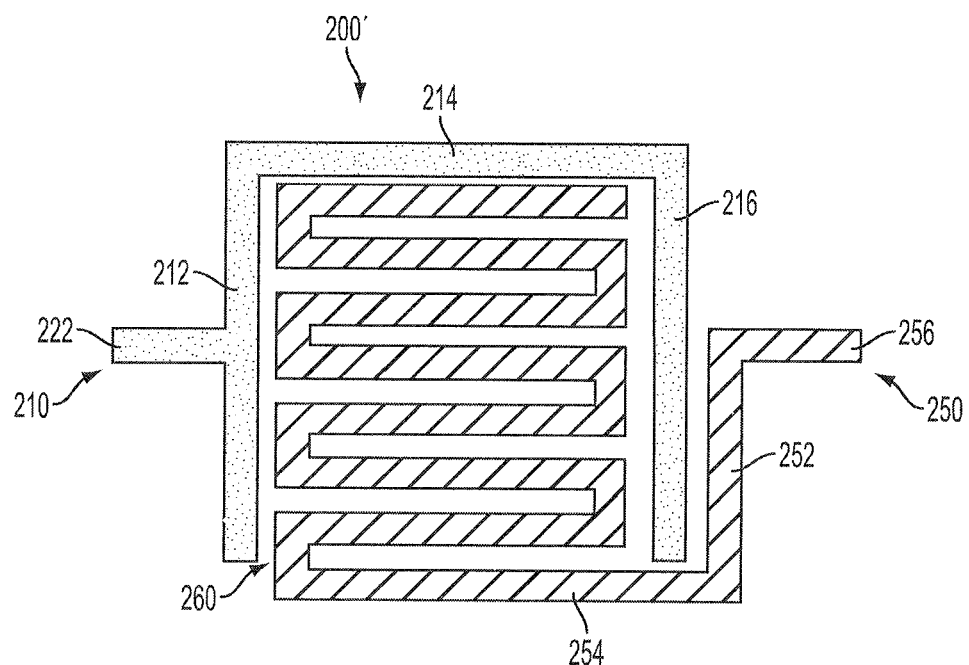

FIG. 2B is a top view of an HV-MOM layout 200' for a unit cell of a capacitor in accordance with one or more embodiments. HV-MOM layout 200' is similar to HV-MOM layout 200. Similar elements have similar reference numbers. In comparison with HV-MOM layout 200, HV-MOM layout 200' lacks first branches 218 and second branches 220. Serpentine structure 260 is not interlaced with portions of first conductive element 210. In comparison with HV-MOM layout 200, HV-MOM layout 200' provides a more stable capacitance value for high voltage applications.

Figure 2C:
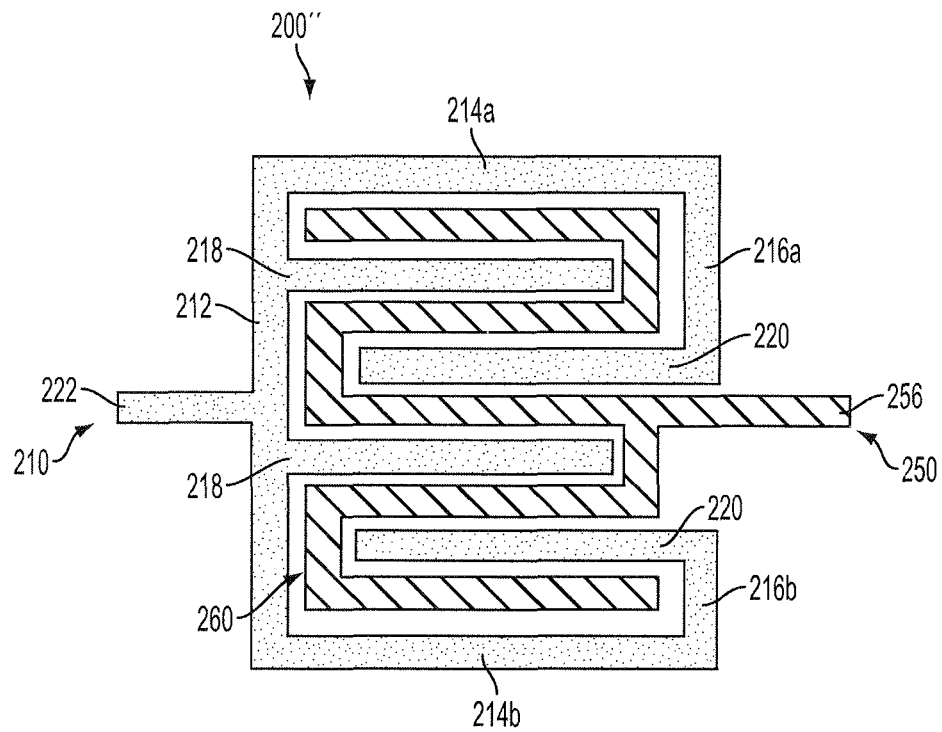

FIG. 2C is a top view of an HV-MOM layout 200" for a unit cell of a capacitor in accordance with one or more embodiments. HV-MOM layout 200" is similar to HV-MOM layout 200. Similar elements have similar reference numbers. In comparison with HV-MOM layout 200, HV-MOM layout 200" includes an upper second leg 214a contacting a first end of first leg 212 and a lower second leg 214b contacting an opposite second end of the first leg. HV-MOM layout 200" also includes an upper third leg 216a contacting to upper second leg 214a and a lower third leg 216b contacting lower second leg 214b. Serpentine structure 260 is directly connected to contact leg 256.

Figure 2D:
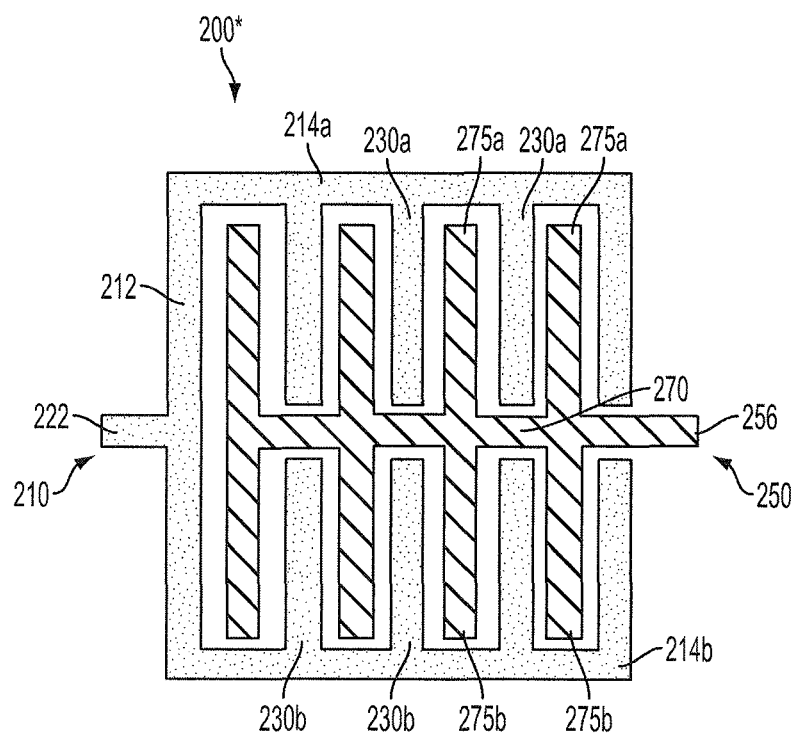

FIG. 2D is a top view of an HV-MOM layout 200* for a unit cell of a capacitor in accordance with one or more embodiments. HV-MOM layout 200* includes first conductive element 210 separated from second conductive element 250. In some embodiments, first conductive element 210 is on a same metal layer as second conductive element 250, e.g., first metal features 116 and additional metal features in first metal layer 115, as described above. In some embodiments, first conductive element 210 and second conductive element 250 are on separate metal layers, e.g., first metal features 116 and second metal features 120. In some embodiments, a separation between first conducive element 210 and second conductive element 250 ranges from about 0.1 microns (µm) to about 0.2 µm.

First conductive element 210 includes first leg 212 extending in the first direction. First conductive element 210 further includes upper second leg 214a connected to the first end of first leg 212. Upper second leg 214a extends in the second direction. First conductive element 210 further includes lower second leg 214b connected to the second end of first leg 212. Lower second leg 214b extends in the second direction. First conductive element 210 further includes a plurality of upper branches 230a extending in the first direction from upper second leg 214a toward lower second leg 214b. First conductive element 210 further includes a plurality of lower branches 230b extending in the first direction from lower second leg 214b toward upper second leg 214a. In some embodiments, first conductive element 210 further includes contact leg 222 configured to receive a voltage signal from a contact, e.g., second contact 126 or third contact 128 (FIG. 1A). In some embodiments, first conductive element 210 is configured to receive a voltage signal at various points along the first conductive elements through conductive vias in an interconnect structure.

Second conductive element 250 includes a center leg 270 extending in the second direction. Second conductive element 250 further includes a plurality of upper branches 275a extending in the first direction from center leg 270 toward upper second leg 214a. Second conductive element 250 further includes a plurality of lower branches 275b extending in the first direction from center leg 270 toward lower second leg 214b. Upper branches 275a extend between adjacent upper branches 230a to form an alternating pattern. Lower branches 275b extend between adjacent lower branches 230b to form an alternating pattern. In some embodiments, second conductive element 250 further includes contact leg 256 configured to receive a voltage signal from a contact, e.g., second contact 126 or third contact 128 (FIG. 1A). In some embodiments, second conductive element 250 is configured to receive a voltage signal at various points along the first conductive elements through conductive vias in an interconnect structure.

Figure 3A:
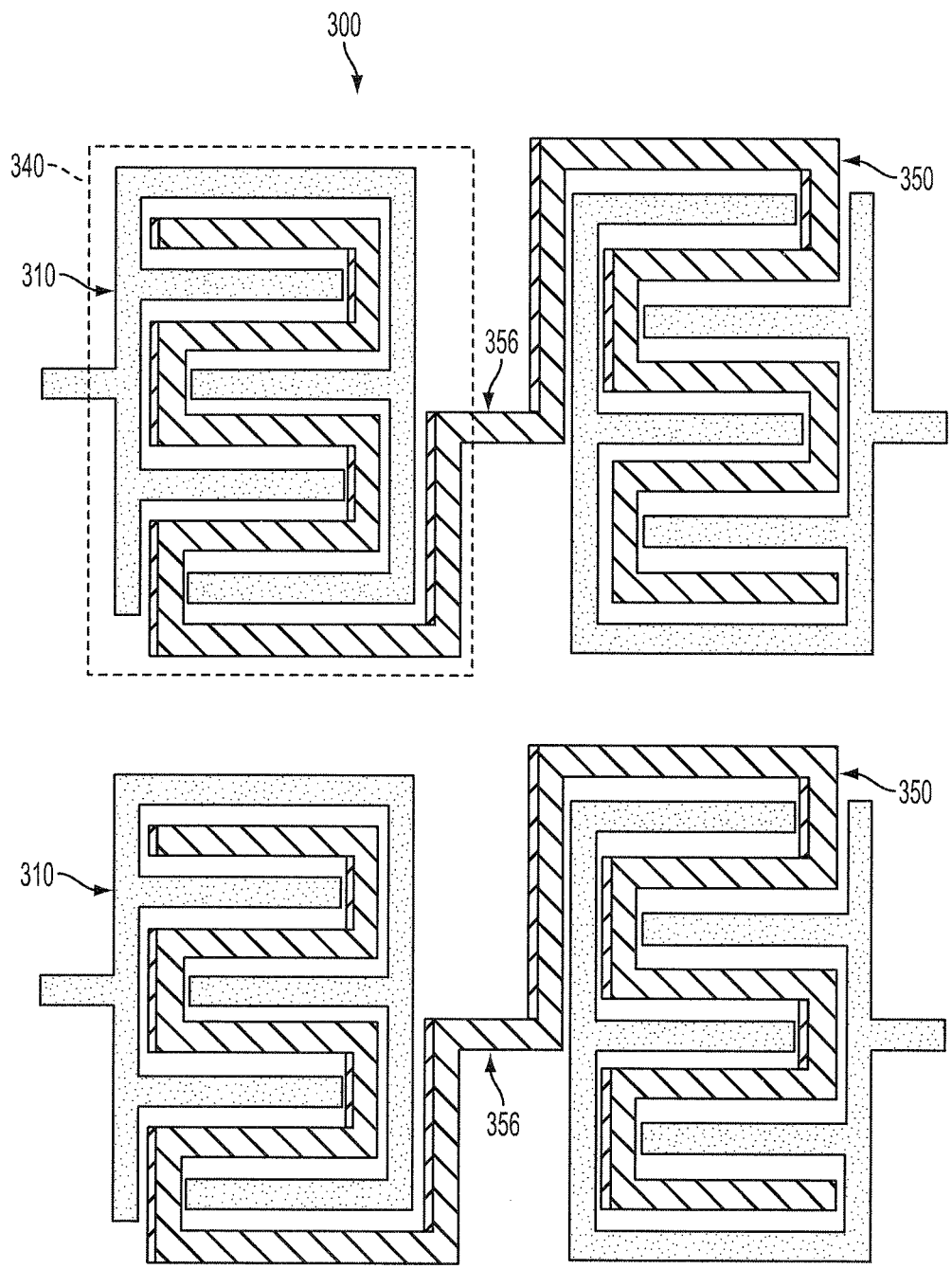
FIGS. 3A-3C are top views of an HV-MOM layout for an array of unit cells of a capacitor in accordance with one or more embodiments.

FIG. 3A is a top view of an HV-MOM layout 300 for an array of unit cells of a capacitor in accordance with one or more embodiments. HV-MOM layout 300 includes four unit cells 340. Each unit cell 340 is similar to HV-MOM layout 200 (FIG. 2A). Similar elements from FIG. 2A have a same reference number increased by 100. In comparison with HV-MOM layout 200, HV-MOM layout 300 includes unit cells 340 spaced from one another in the second direction connected by a contact leg 356. In some embodiments, contact leg 356 connects unit cells 340 spaced from one another in the first direction. In some embodiments, an additional contact leg connects unit cells 340 spaced from one another in the first direction, so that all four unit cells are connected. In some embodiments, HV-MOM layout 300 includes more or less than four unit cells 340.

Figure 3B:
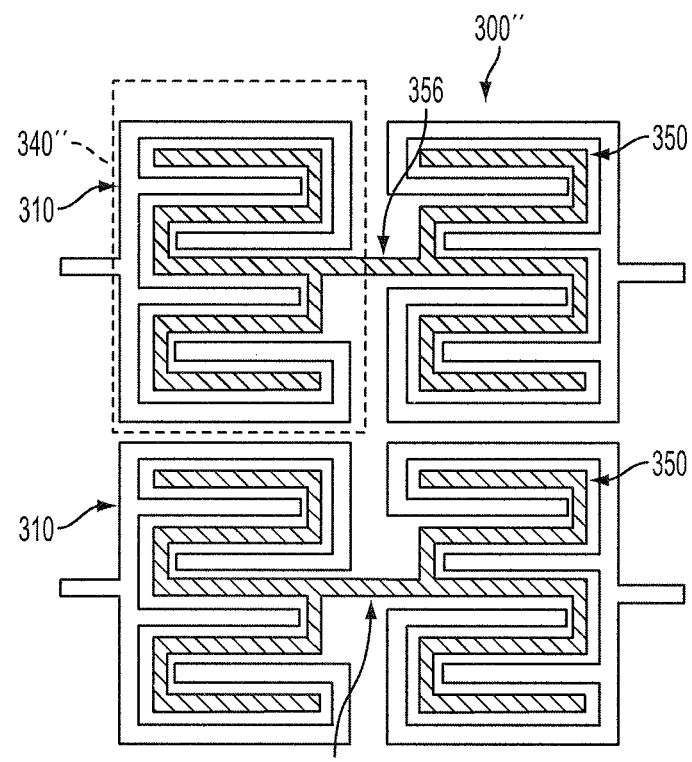

FIG. 3B is a top view of an HV-MOM layout 300" for an array of unit cells of a capacitor in accordance with one or more embodiments. HV-MOM layout 300" includes four unit cells 340". Each unit cell 340" is similar to HV-MOM layout 200" (FIG. 2C). Similar elements from FIG. 2C have a same reference number increased by 100. In comparison with HV-MOM layout 200", HV-MOM layout 300" includes unit cells 340" spaced from one another in the second direction connected by a contact leg 356. In some embodiments, contact leg 356 connects unit cells 340 spaced from one another in the first direction. In some embodiments, an additional contact leg connects unit cells 340 spaced from one another in the first direction, so that all four unit cells are connected. In some embodiments, HV-MOM layout 300" includes more or less than four unit cells 340".

Figure 3C:
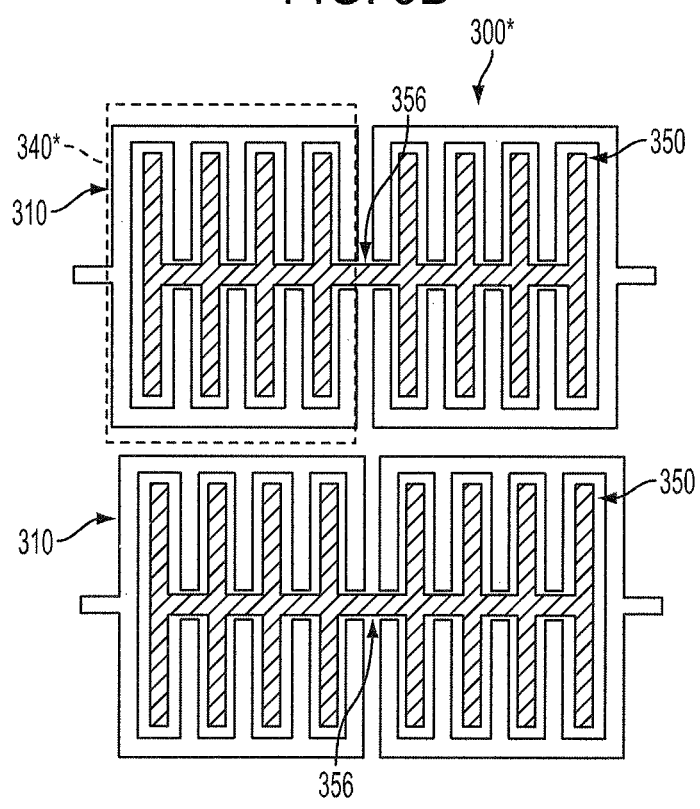

FIG. 3C is a top view of an HV-MOM layout 300* for an array of unit cells of a capacitor in accordance with one or more embodiments. HV-MOM layout 300* includes four unit cells 340*. Each unit cell 340* is similar to HV-MOM layout 200* (FIG. 2D). Similar elements from FIG. 2D have a same reference number increased by 100. In comparison with HV-MOM layout 200*, HV-MOM layout 300* includes unit cells 340* spaced from one another in the second direction connected by a contact leg 356. In some embodiments, contact leg 356 connects unit cells 340 spaced from one another in the first direction. In some embodiments, an additional contact leg connects unit cells 340 spaced from one another in the first direction, so that all four unit cells are connected. In some embodiments, HV-MOM layout 300* includes more or less than four unit cells 340*.

Figure 4:
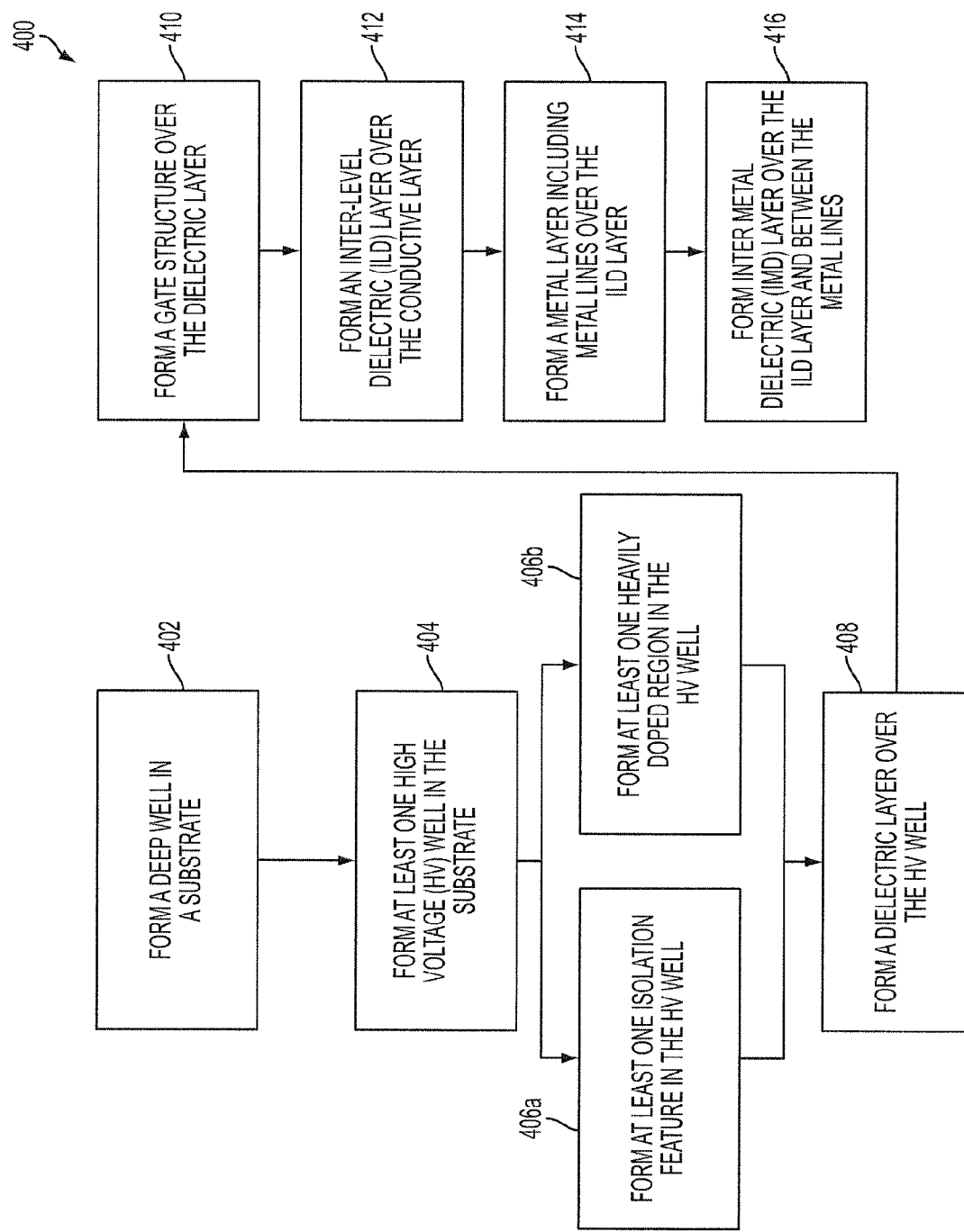
FIG. 4 is a flow chart of a method of making an HV-MOM device in accordance with one or more embodiments.

FIG. 4 is a flow chart of a method 400 of making an HV-MOM device in accordance with one or more embodiments. Method 400 begins with operation 402 in which a deep well is formed in a substrate. In some embodiments, a shape of the deep well is defined by depositing, developing and patterning a mask over the substrate. The deep well is formed by ion implantation through the mask. In some embodiments, the ion implantation is performed at an energy ranging from about 1000 k eV to about 1500 k eV. In some embodiments, the ion implantation continues until a dopant concentration of the deep well reaches a value of about $1\times10^{15}$ atoms/cm$^3$ to about $1\times10^{18}$ atoms/cm$^3$. In some embodiments, the dopants are p-type dopants, such as boron, boron di-fluoride or other suitable p-type dopants. In some embodiments, the dopants are n-type dopants, such as phosphorous, arsenic, or other suitable n-type dopants.

In some embodiments, an anneal process is performed following the ion implantation process. To prevent significant diffusion of dopants, such as boron, arsenic, phosphorus, etc., the peak anneal temperature should be equal to or less than about 1010° C. for rapid thermal anneal (RTA). The duration of such RTA, or rapid thermal processing (RTP) anneal, is affected by the anneal temperature. For a higher anneal temperature, the anneal time is kept lower. In some embodiments, the RTA duration is equal to or less than about 60 seconds. For example, the anneal process is performed at a temperature in a range from about 750° C. to about 850° C. for a duration in a range from about 5 seconds to about 60 seconds, in accordance with some embodiments. If millisecond anneal (or flash anneal) is used, the peak anneal temperature is higher than the RTA temperature and the duration is reduced. In some embodiments, the peak anneal temperature is equal to or less than about 1250° C. The duration of the millisecond anneal is equal to or less than about 40 milliseconds, in accordance with some embodiments.

Figure 5A:
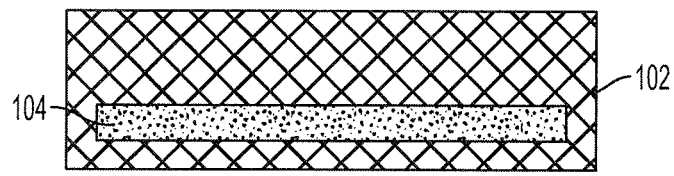
FIGS. 5A-5F are cross-sectional view of an HV-MOM device at various stages of production in accordance with one or more embodiments.

FIG. 5A is a cross-sectional view of an HV-MOM device following operation 402 in accordance with one or more embodiments. In the arrangement of FIG. 5A, deep well 104 is formed in substrate 102.

Returning to FIG. 4, method 400 continues with operation 404 in which at least one high voltage well is formed in the substrate. In some embodiments, the high voltage well is formed by depositing, developing and patterning a mask formed over the substrate. In some embodiments, the high voltage well is formed by ion implantation through the patterned mask. In some embodiments, the ion implantation process continues until a dopant concentration of the high voltage well reaches a value of from $1\times10^{14}$ atoms/cm$^3$ to $1\times10^{19}$ atoms/cm$^3$.

In some embodiments, the high voltage well includes an epi-layer grown over the substrate. In some embodiments, the epi-layer is doped by adding dopants during the epitaxial process. In some embodiments, the epi-layer is doped by ion implantation after the epi-layer is formed.

Method 400 continues with either operation 406a or operation 406b. In embodiments, which include operation 406a, at least one isolation feature is formed in the high voltage well. In some embodiments, the isolation feature includes shallow trench isolation (STI), local oxidation of silicon (LOCOS), or other suitable isolation features. In some embodiments, the isolation feature is formed by implanting a dopant of an opposite type of the high voltage well to render a portion of the high voltage well neutrally charged. In some embodiments, the isolation feature is formed by etching the high voltage well to form an opening and filling the opening with non-conductive material. In some embodiments, the isolation features are formed by performing an oxidation process on a portion of the high voltage well.

In embodiments which include operation 406b, at least one heavily doped region is formed in the high voltage well. In some embodiments, the heavily doped region includes either p-type dopants or n-type dopants. In some embodiments, the heavily doped region is formed by depositing, developing and patterning a mask formed over the substrate. In some embodiments, the heavily doped region is formed by ion implantation through the patterned mask. In some embodiments, the ion implantation process continues until a dopant concentration of the heavily doped region reaches a value of from $1\times10^{20}$ atoms/cm$^3$ to $1\times10^{23}$ atoms/cm$^3$.

Figure 5B:
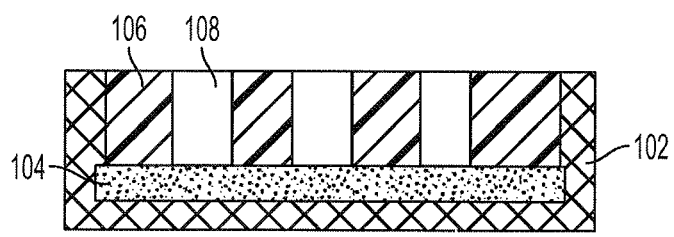

FIG. 5B is a cross-sectional view of an HV-MOM device following operation 406a in accordance with one or more embodiments. In the arrangement of FIG. 5B, a plurality of high voltage wells 106 are formed in substrate 102 and a plurality of isolation features 108 are formed the high voltage wells to separate adjacent high voltage wells from each other.

Returning to FIG. 4, method 400 continues with operation 408 in which a dielectric layer is formed over the high voltage well. In some embodiments, the dielectric layer is formed by CVD, PVD, sputtering, atomic layer deposition (ALD) or another suitable formation process. In some embodiments, the dielectric layer is etched to expose either the heavily doped region or the isolation feature. In some embodiments, the dielectric layer is not etched and covers both the high voltage well and an isolation feature in the high voltage well.

Figure 5C:
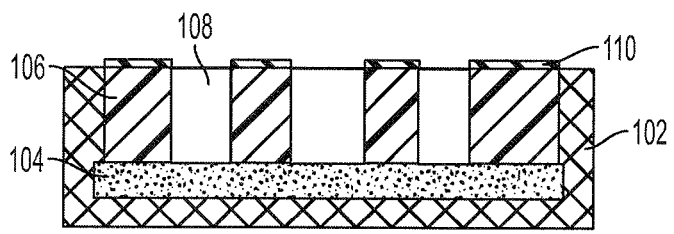

FIG. 5C is a cross-sectional view of an HV-MOM device following operation 408 in accordance with one or more embodiments. In the arrangement of FIG. 5C, dielectric layer 110 is over high voltage wells 106 and exposes isolation features 108.

Returning to FIG. 4, method 400 continues with operation 410 in which a gate structure is formed over the dielectric layer. The gate structure is not over the isolation feature or the heavily doped regions. In some embodiments, the gate structure is formed by CVD, PVD, sputtering, or another suitable formation process. In some embodiments, the gate structure is blanket deposited and then etched to remove a portion of the gate structure over either the heavily doped region or the isolation feature. In some embodiments, the gate structure is selectively deposited so that the gate structure is not over the heavily doped region or the isolation feature.

Figure 5D:
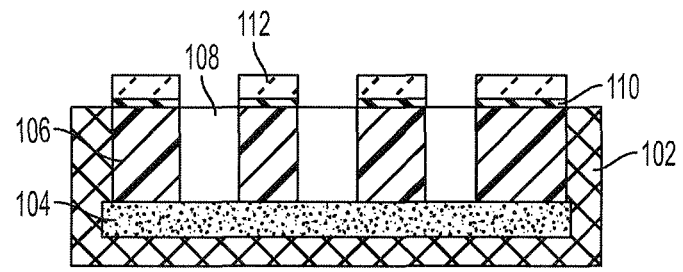

FIG. 5D is a cross-sectional view of an HV-MOM device following operation 410 in accordance with one or more embodiments. In the arrangement of FIG. 5D, gate structure 112 is formed over dielectric layer 110.

Returning to FIG. 4, method 400 continues with operation 412 in which an inter-level dielectric (ILD) layer is formed over the gate structure. The ILD layer surrounds the gate structure and the dielectric layer. In some embodiments where the dielectric layer does not cover the isolation feature or the heavily doped region, the ILD layer is in contact with the isolation feature or the heavily doped region. In some embodiments, the ILD layer is formed by CVD, PVD, sputtering, or another suitable formation process. In some embodiments, the ILD layer is formed using multiple formation processes.

Figure 5E:
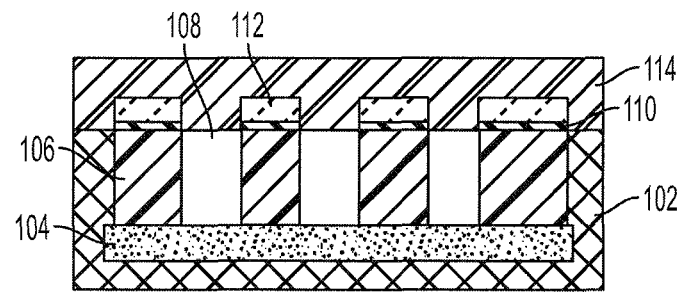

FIG. 5E is a cross-sectional view of an HV-MOM device following operation 412 in accordance with one or more embodiments. In the arrangement of FIG. 5E, ILD layer 114 surrounds gate structure 112 and dielectric layer 110.

Returning to FIG. 4, method 400 continues with operation 414 in which a metal layer is formed over the ILD layer. The metal layer includes metal lines or metal vias. In some embodiments, the metal layer includes at least two separate metal features used to form a capacitor. In some embodiments, the metal layer is formed by PVD, sputtering, ALD or another suitable formation process.

Figure 5F:
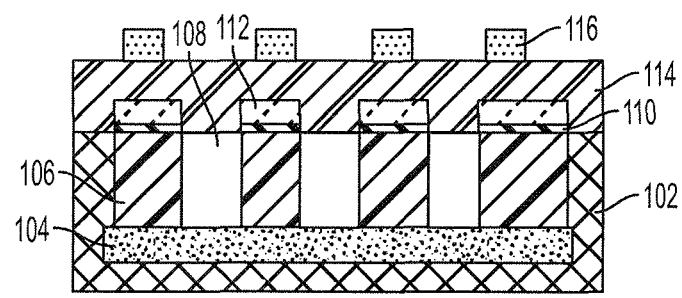

FIG. 5F is a cross-sectional view of an HV-MOM device following operation 414 in accordance with one or more embodiments. In the arrangement of FIG. 5F, metal features 116 are formed on ILD layer 114.

Returning to FIG. 4, method 400 continues with operation 416 in which an inter-metal dielectric (IMD) layer is formed over the ILD layer. The IMD layer surrounds the features of the metal layer. In some embodiments, the IMD layer is formed by CVD, PVD, sputtering, or another suitable formation process. In some embodiments, the IMD layer is formed using multiple formation processes. In some embodiments, operation 416 occurs prior to operation 414 and the metal layer is formed in the IMD layer using a dual damascene process.

In some embodiments, operations 414 and 416 are repeated multiple times in order to form capacitors on different metal layers or to form at least one capacitor which spans multiple metal layers.

One aspect of this description relates to a high voltage metal-oxide-metal (HV-MOM) layout. The HV-MOM layout includes a first conductive element. The first element includes a first leg extending in a first direction, a second leg connected to the first leg, the second leg extending in a second direction different from the first direction, and a third leg connected to the second leg, the third leg extending in a first direction. The HV-MOM layout further includes a second conductive element separated from the first conductive element by a space. The second conductive element includes a serpentine structure, wherein the serpentine structure is enclosed on at least three sides by the first conductive element. The HV-MOM layout further includes a dielectric material filling the space between the first conductive element and the second conductive element.

Another aspect of this description relates to a method of making a high voltage metal-oxide-metal (HV-MOM) device. The method includes forming a deep well in a substrate and forming at least one high voltage well in the substrate over the deep well. The method further includes forming a dielectric layer over each high voltage well of the at least one high voltage well and forming a gate structure over the dielectric layer. The method further includes forming an inter-level dielectric (ILD) layer over the substrate, the ILD layer surrounding the gate structure. The method further includes forming a first inter-metal dielectric (IMD) layer over the ILD layer and forming a first metal feature in the first IMD layer, wherein the first metal feature is part of a MOM capacitor.

Still another aspect of this description relates to a high voltage metal-oxide-metal (HV-MOM) device. The HV-MOM device includes a substrate, and a deep well in the substrate. The HV-MOM device further includes at least one high voltage well in the substrate over the deep well. The HV-MOM device further includes a dielectric layer over the at least one high voltage well, and a gate structure over the dielectric layer. The HV-MOM device further includes an inter-layer dielectric (ILD) layer over the substrate, the ILD layer surrounding the gate structure. The HV-MOM device further includes a first conductive feature over the ILD layer, wherein the first conductive feature is part of a MOM capacitor. The first conductive feature includes a first leg extending in a first direction. The first conductive feature further includes a second leg connected to the first leg, the second leg extending in a second direction different from the first direction. The first conductive feature further includes a third leg connected to the second leg, the third leg extending in a first direction. The HV-MOM device further includes a second conductive feature over the ILD layer, wherein the second conductive feature is separated from the first conductive feature by a space, the second conductive feature has a serpentine structure, and the serpentine structure is enclosed on at least three sides by the first conductive feature. The HV-MOM device further includes a dielectric material filling the space between the first conductive feature and the second conductive feature.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A high voltage metal-oxide-metal (HV-MOM) layout comprising:
   a first conductive element comprising:
      a first leg extending in a first direction;
      a second leg connected to the first leg, the second leg extending in a second direction different from the first direction;
      a third leg connected to the second leg, the third leg extending in a first direction, and
      a first contact leg extending from the first leg in the second direction, wherein the first contact leg is configured to receive a first signal;
   a second conductive element separated from the first conductive element by a space, the second conductive element comprising:
      a serpentine structure, wherein the serpentine structure is enclosed on at least three sides by the first conductive element, and a second contact leg configured to receive a voltage signal, the second contact leg configured to transfer the voltage signal directly to the serpentine structure; and a dielectric material filling the space between the first conductive element and the second conductive element.

2. The HV-MOM layout of claim 1, wherein the first conductive element further comprises:
 a first plurality of branches extending from the first leg in the second direction toward the third leg; and
 a second plurality of branches extending from the third leg in the second direction toward the first leg, wherein the serpentine structure is interlaced with the first plurality of branches and the second plurality of branches in an alternating fashion.

3. The HV-MOM of claim 1, wherein the second leg comprises an upper second leg connected to a first end of the first leg and a lower second leg connected to a second end of the first leg opposite the first end of the first leg.

4. The HV-MOM layout of claim 3, wherein the third leg comprises an upper third leg connected to the upper second leg, a lower third leg connected to the lower second leg, and the upper third leg is not continuous with the lower third leg.

5. A high voltage metal-oxide-metal (HV-MOM) layout comprising:
 a first conductive element comprising:
  a first leg extending in a first direction;
  a second leg connected to the first leg, the second leg extending in a second direction different from the first direction;
  a third leg connected to the second leg, the third leg extending in a first direction, and
  a first contact leg extending from the first leg in the second direction, wherein the first contact leg is configured to receive a first signal;
 a second conductive element separated from the first conductive element by a space, the second conductive element comprising:
  a serpentine structure, wherein the serpentine structure is enclosed on at least three sides by the first conductive element
  a second contact leg configured to receive a voltage signal, and
  at least one additional leg configured to transfer the voltage signal from the second contact leg to the serpentine structure; and
 a dielectric material filling the space between the first conductive element and the second conductive element.

6. The HV-MOM layout of claim 5, wherein the first conductive element further comprises:
 a first plurality of branches extending from the first leg in the second direction toward the third leg; and
 a second plurality of branches extending from the third leg in the second direction toward the first leg, wherein the serpentine structure is interlaced with the first plurality of branches and the second plurality of branches in an alternating fashion.

7. A method of making a high voltage metal-oxide-metal (HV-MOM) device, the method comprising:
 implanting a deep well in a substrate;
 implanting at least one high voltage well in the substrate over the deep well, wherein an uppermost surface of the deep well is below an uppermost surface of the at least one high voltage well;
 depositing a dielectric layer over each high voltage well of the at least one high voltage well;
 forming a gate structure over the dielectric layer;
 depositing an inter-layer dielectric (ILD) layer over the substrate, the ILD layer surrounding the gate structure;
 depositing a first inter-metal dielectric (IMD) layer over the ILD layer; and
 depositing a first metal feature in the first IMD layer, wherein the first metal feature is part of a MOM capacitor.

8. The method of claim 7, further comprising forming at least one isolation feature in the substrate, wherein forming the at least one high voltage well comprises forming a plurality of high voltage wells and forming the at least one isolation feature comprises forming the at least one isolation feature between adjacent high voltage wells of the plurality of high voltage wells.

9. The method of claim 8, wherein depositing the dielectric layer comprises forming the dielectric layer over each isolation feature of the at least one isolation feature, and a portion of the dielectric layer over each isolation feature of the at least one isolation feature is in contact with the ILD layer.

10. The method of claim 8, wherein forming the at least one isolation feature comprises forming the at least one isolation feature having a same height as the at least one high voltage well.

11. The method of claim 7, further comprising implanting at least one heavily doped region in the at least one high voltage well, wherein a dopant concentration of the heavily doped region is greater than a dopant concentration of the at least one high voltage well.

12. The method of claim 7, further comprising depositing a second metal feature over the ILD layer, wherein the second metal feature is separated from the first metal feature by a space, the second metal feature has a serpentine structure, and the serpentine structure is enclosed on at least three sides by the first metal feature.

13. The method of claim 12, wherein depositing the second metal feature comprises depositing the second metal feature in the first 1 MB layer.

14. The method of claim 12, wherein depositing the second metal feature comprises depositing the second metal feature over the first 1 MB layer.

15. A high voltage metal-oxide-metal (HV-MOM) device comprising:
 a substrate;
 a deep well in the substrate;
 at least one high voltage well in the substrate over the deep well;
 a dielectric layer over the at least one high voltage well;
 a gate structure over the dielectric layer;
 an inter-layer dielectric (ILD) layer over the substrate, the ILD layer surrounding the gate structure;
 a first conductive feature over the ILD layer, wherein the first conductive feature is part of a MOM capacitor, and the first conductive feature comprises:
  a first leg extending in a first direction;
  a second leg connected to the first leg, the second leg extending in a second direction different from the first direction; and
  a third leg connected to the second leg, the third leg extending in a first direction;
 a second conductive feature over the ILD layer, wherein the second conductive feature is separated from the first conductive feature by a space, the second conductive feature has a serpentine structure, and the serpentine structure is enclosed on at least three sides by the first conductive feature; and a dielectric material filling the space between the first conductive feature and the second conductive feature, wherein the dielectric layer is a continuous dielectric layer over each high voltage well of the at least one high voltage well.

16. The HV-MOM of claim 15, further comprising a plurality of isolation regions over the deep well, wherein a first high voltage well of the at least one high voltage well separates adjacent isolation regions of the plurality of isolation regions.

17. The HV-MOM of claim 16, wherein the dielectric layer extends over at least one isolation region of the plurality of isolation regions.

18. The HV-MOM of claim 15, further comprising a plurality of heavily doped regions in the at least one high voltage well, wherein a first high voltage well of the at least one high voltage well separates adjacent heavily doped regions of the plurality of heavily doped regions.

19. The HV-MOM of claim 15, wherein the first conductive feature is on a same metal level as the second conductive feature.

20. The HV-MOM of claim 15, wherein the first conductive feature is on a different metal level from the second conductive feature.

* * * * *